United States Patent [19]

Johns et al.

[11] Patent Number: 4,874,124

[45] Date of Patent: Oct. 17, 1989

[54] PROCESS FOR CARRYING OUT THE SOLDERING OF ELECTRONIC COMPONENTS ON A SUPPORT

[75] Inventors: Ken W. E. Johns, Ashford; Stuart Briggs, Richmond, both of England; Luciano Flabbi, Milan, Italy

[73] Assignee: Montedison S.p.A., Italy

[21] Appl. No.: 149,979

[22] Filed: Jan. 26, 1988

Related U.S. Application Data

[63] Continuation of Ser. No. 836,144, Mar. 4, 1986, abandoned.

[30] Foreign Application Priority Data

Mar. 6, 1985 [IT] Italy .................. 19790A/85

[51] Int. Cl.$^4$ .................. B23K 31/02; C09K 5/00
[52] U.S. Cl. .................. 228/180.1; 228/240; 252/78.1; 568/615
[58] Field of Search .................. 252/78.1; 568/615; 228/180.1, 240

[56] References Cited

U.S. PATENT DOCUMENTS

| | | | |
|---|---|---|---|
| 2,500,388 | 3/1950 | Simons | 2152/78.1 |
| 3,054,174 | 9/1962 | Rose et al. | 228/180.1 |
| 3,242,218 | 3/1966 | Miller | 568/615 |
| 3,322,826 | 5/1967 | Moore | 252/54 |
| 3,388,465 | 6/1968 | Johnston | 228/212 |
| 3,665,041 | 5/1972 | Sianesi et al. | 252/54 |
| 3,825,994 | 7/1974 | Coleman | 228/37 |
| 3,866,307 | 2/1975 | Piahl et al. | 228/240 X |
| 4,149,016 | 4/1979 | Toy et al. | 252/77 |
| 4,334,646 | 6/1982 | Campbell | 228/180.2 |
| 4,549,686 | 10/1985 | Sargent et al. | 228/180.1 |

FOREIGN PATENT DOCUMENTS

2139132 11/1984 United Kingdom .

OTHER PUBLICATIONS

C. J. Brierley et al. Techniques for Soldering Surface Mounted Devices to Printed Circuit Boards, in "Brazing and Soldering", n. 7, Autumn 1984, pp. 25–30.
D. Schoenthaler, "Solder Fusing with Heated Liquids", in Welding Research Supplement, Nov. 1974, pp. 498 s–509 s.

*Primary Examiner*—Robert A. Wax
*Attorney, Agent, or Firm*—Stevens, Davis, Miller & Mosher

[57] ABSTRACT

Electronic components are welded or soldered or bonded to a support by arranging said components on the surface of the support and/or in holes piercing the support, in the presence of soldering materials having binding properties, and by then putting the thus-obtained assembly in contact with a perfluoropolyether in the liquid state, said perfluoropolyether having a temperature at least equal to that at which the soldering material develops its binding properties.

12 Claims, No Drawings

PROCESS FOR CARRYING OUT THE SOLDERING OF ELECTRONIC COMPONENTS ON A SUPPORT

This application is a continuation of application Ser. No. 836,144, filed Mar. 4, 1986, now abandoned.

The present invention relates to a process for carrying out the welding of manufactured articles by means of suitable soldering materials, where ever there is required an application of heat with a gradual and controlled increase of the temperature. More particularly, this invention relates to a process for the welding or soldering of electronic components on a support, by means of such soldering materials. This is also known as "bonding."

Different methods are presently being used for welding or soldering electronic components on suitable supports. One of these methods, known as wave soldering, is commonly used for soldering devices/components mounted on the support with their connections passing through metallized holes in turn passing through the support itself.

According to the wave soldering method, the lower part of the support, opposite to that on which are mounted the components, is wetted by a wave of molten metal, in general a tin-lead alloy, which penetrates the metallized holes of the support and coats a metallized area around the connection of the device. When the supporting plate is withdrawn from the metal wave, the metal deposited on the support, while cooling down, solidifies and thus connects the components with the support. This method, displays, however, some wellknown drawbacks (described for example in the article titled: "Technique for Soldering Surface Mounted Devices (SMD) to Printed Circuit Boards (PCb)" by C. J. Brierley et al., which appeared in "Brazing and Soldering", Autumn 1984), in the case in which the components are mounted on the surface of the support ('Surface Mounted devices' - SMD), without having recourse to holes but by simply glueing (sticking) and setting (putting) the components on one or both faces of the support.

In the case of components mounted on the surface (SMD) a second system may be used, which consists in mounting the SMD on the support in the desired position on suitable metallized traces obtained by putting a suitable welding cream on the support.

The assembly is then heated up by conduction, convection or radiation, or a combination of these three ways, by means of a suitable system, for instance by means of hot air, infrared radiation, or by the saturated vapor of an inert substance, so as to remelt or reflow the soldering cream which, successively cooling down, will insure the desired mechanical-electrical connection between the components and the support. The saturated vapor system, which is presently known as one of the most effective for the soldering by solder reflow of the SMD, consists in immersing the assembly into a saturated vapor of an inert fluid, usually perfluoro-carbons. In this case there is used the latent heat of the vapors which condense onto the assembly re-melting or reflowing the soldering material (soldering in vapor phase or Vapor Phase Soldering). This method is described in a number of articles and patents, amongst which may, for instance, be cited British Patent No. 2,139,132 and U.S. Pat. No. 3,866,307.

However, the V.P.S. method shows certain drawbacks amongst which the most important is the fact that the operational temperature is a single predetermined temperature, since it is fixed by the boiling temperature of the fluid. This limits the choice of the soldering alloys to those whose melting point is lower than the boiling temperature of the fluid.

Also known prior art—see for example "Solder Fusing with Heated Fluids" by D. Schoelthaler in "Welding Research Supplement" of November '74—is the possibility of immersing the articles in hot fluids, such as for instance glycerine, polyglycols, fluorinated oxypropylenes polychlorotrifluoroethylene, polyphenyl ethers, mineral and vegetable oils, generally in mere finishing operations on printed circuits. For example for rounding (by re-melting or re-flowing) tin-lead residues or other metal alloy residues left over by previous operations (for instance in operations of electro-deposition) and not cleanly cut, or in operations for the homogeneization of the product or for the manufacture of the electrical infraconnections to the supports. However, the use of such fluids creates a number of different problems and, thus, it is not advisable to extend their use for more important applications such as real and proper weldings.

The main drawback in the use of fluorinated oxypropylenes lies in the alteration of the angle of contact following the prolonged use, with the consequential worsening of the welding. The polychlorotrifluoroethylenes, following a prolonged use, generate hydrolytically unstable compounds and yield liquid cleavage products with a lower molecular weight and with too low viscosity and boiling point. Moreover, the polychlorotrifluoroethylenes used in the cited technique must necessarily possess boiling points well above the melting points of the soldering alloys in order to avoid that, besides the losses due to decomposition, there may be also losses due to evaporation. This means that one should use polychlorotrifluoroethylenes with a relatively high molecular weight, which consequently, although having a low vapor tension, have a high viscosity. This means that the pieces coming out of the bath would remove, by drag-out, inordinately high quantities of fluid.

As far as the other fluids are concerned, these are in their totality inflammable or insufficiently stable under conditions of use, that is, in contact with air. So much so that sometimes vegetable oil is placed over a bath of molten metal, because in this way the oil, reacting with the atmospheric oxygen, will protect the underlying metal from oxidation. As is well known, in fact, the welding or soldering shows better properties when the metal is not allowed to come into contact with oxygen.

In accordance with the present invention, a soldering method has now been found that overcomes all of the afore-mentioned drawbacks. According to this method, the components are mounted onto the support in any desired position, whether onto the surface, on both faces of the support, or through metallized holes made in the support itself, where they are kept in position by special materials (herein defined as soldering materials, creams or pastes) endowed with binding properties, deposited on the surface, or previously inserted into the metallized holes of the support, and by subsequently developing the binding properties of said materials by heating, obtained by the contact of one or both surfaces of the support with a perfluoropolyether in the liquid state which is at a suitable temperature.

The perfluoropolyethers are products per se well known in the prior art. Their preparation will be found described in numerous patents, such as for example: in British Patent Nos. 1,104,482, 1,153,306, 1,189,337, 1,217,871, in U.S. Pat. Nos. 3,242,218, 3,665,041, 3,715,378, and in Italian Patent Application No. 19,496 A/85 corresponding to U.S. application Ser. No. 828,682, filed Feb. 12, 1986, and European Patent Application No. 191,490, published Aug. 20, 1986. There may be used with the present invention the perfluoropolyethers with kinematic viscosity values, at temperature of 20° C., between 10 and 2000 cSt., and which, moreover, are non-boiling at atmospheric pressure and show a loss by evaporation of less than 1% by weight at a temperature of 150° C. (measured according to ASTM D 976/56 standard).

The suitability of the perfluoropolyethers for welding or soldering in liquid phase proves to be surprising as well as the fact that said compounds are permeable to oxygen, wherefore it would be feared that they would allow an oxidation of the molten metal, just as described previously.

The present invention thus provides a process for connecting electronic components to a support, which consists or consists essentially in arranging said components on the support together with a welding or soldering material, and by then bringing the assembly thus obtained into contact with a perfluoropolyether in the liquid state, and which is at a temperature equal to or greater than the temperature at which said soldering material develops its binding properties.

Preferred perfluoropolyethers for the above-mentioned soldering process are those of the formula:

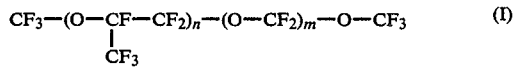

wherein n is a number between 5 and 50, while m is a number such that the ratio n/m is between 10 and 50.

Other suitable perfluoropolyethers are, in particular, those belonging to the following classes:

(II) $C_3F_7O(C_3F_6O)_m-R_f$ wherein $R_f$ may be $-C_2F_5$; $-C_3F_7$; or $-CFHCF_3$ while m is an integer.

(III) $CF_3O(C_3F_6O)_m(C_2F_4O)_n(CFXO)-CF_3$ wherein: X is equal either to $-F$ or to $-CF_3$; m, n and q are integers whose sum is between 10 and 300; n/q=0.5−5; and m/q+n=0.01−0.4.

(IV) $CF_3O(C_2F_4O)_p(CF_2O)_qCF_3$, wherein: p and q are integers equal to or different from each other, and where the ratio p/q is between 0.5 and 1.5

(V) $R_f(OCF_2CF_2CF_2)_nOR_f$, wherein: $R_f$ is F, perfluoroalkyl, perfluoro-oxyalkyl or perfluoropolyoxyalkyl.

(VI) Perfluoropolyethers of oxetanic structure, as described in Italian Patent Application No. 19,496 A/85, viz.

(1)

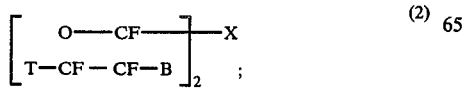
(2)

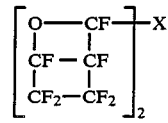
(3)

(4)

wherein A=F, a perfluoroalkyl radical with 1 to 8 carbon atoms, a group

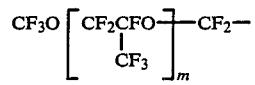

in which m is an integer from 1 to 5 (extremes included), a group

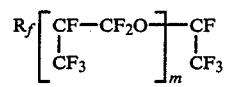

in which m has the same meaning specified hereinabove and $R_f$ is a perfluoroalkyl with 1 to 8 carbon atoms; B and T, like or unlike each other, bay be: F, perfluoroalkyl radical with 1 to 7 carbon atoms, a group

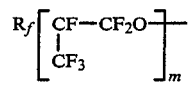

in which m and $R_f$ have the same meaning as specified hereinabove; X is equal to a group $-CF_2O-(CF_2O)-_p-(C_2F_4O)_q-CF_2-$ wherein p and q, like or unlike each other, are integers from 0 to 5 (extremes included) and the sum p+q is at least equal to 1, or a group $-(CF_2)_r-$ in which r is an integer from 1 to 8; and characterized in that at least one of groups A, B, T in class (1), or B, T, X in class (2), is $\neq F$ and contains one or more ether oxygen atoms; in classes (3) and (4) the groups X and A are $\neq F$ and are selected from the above-indicated radicals containing one or more ethereal oxygen atoms; and furthermore characterized in that when one of radicals B or T is equal to group

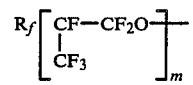

the other is equal to F, radicals A, B, T are preferably selected from:

A = $CF_3-CF_2$, $CF_3(CF_2)_6$, 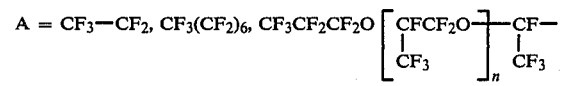

where n=0, 1, 2, more preferably 0,1; B and T, like or unlike each other, are:

F, CF$_3$, CF$_3$(CF$_2$)$_4$,

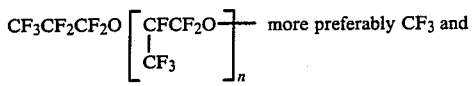 more preferably CF$_3$ and wherein n has the meaning specified hereinbefore.

The temperature at which the process according to the present invention is conducted must be at least equal to the temperature at which the soldering materials present on the support develop their binding properties through heating.

As soldering or welding materials there may be used all those used conventionally in soldering processes, and consisting of a soldering metal or alloy or of a soldering metal or alloy incorporated in suitable fluxes, de-oxidizers and various additives, inclusive of solvents such as isopropanol.

Examples of such metals and alloys are tin; tin-lead alloys (for instance those with ratios Sn/Pb=63/37; 60/40; 50/50; tin/silver alloys (e.g.: with ratios Sn/Ag=96.5/3.5; 95/5; tin/antimony alloys (95/5, 99/1); tin/lead/silver alloys (62/36/2); cadmium/tin alloys, etc., generally with melt temperatures between 180° and 250° C.

The binding action of said soldering materials develops through the melting and successive cooling down of the material.

Fluxes have, as is well known to the skilled in the art, two specific functions. The first is that of removing the oxidized film coating the metal soldering materials. The second function is that of helping the heat transfer during the soldering operation. As fluxes there are used in general weak acids, such as for example rosin (colophony) and other resinous acids, or organic salts such as methylammonium chloride.

Likewise there may be used soldering materials of a non-metallic type, electrically conductive, provided they are capable of exerting a binding action through the heating and cooling cycle. Examples of such materials are epoxy and acrylic resins capable of exerting the binding action through vulcanization or cross-linking.

The support for the electronic components may be constituted by different materials such as for instance glass fibers impregnated with epoxy or phenolic resins; plastic laminates based on epoxy or phenolic resins; ceramic materials consisting of sintered alumina powders; or metallic materials or plastic materials in general.

The process of this invention may be applied independently of the method by which there had been traced the electrical connections among the various different components which are to be connected, and independently of the method by which the soldering material is applied.

The electronic components are mounted on the surface of the support on metallized traces made of soldering materials (creams) or of other conductive materials pre-deposited, or inserted either through metallized holes filled with soldering cream, or through holes into which there has been inserted preformed soldering pastes.

The contact between the support and the liquid perfluoropolyether, according to the present invention, may be achieved in various ways. Amongst these, just for exemplifying purposes, there may be cited:

the skimming of the undersurface of the support by a wave of liquid;

the crossing by the support of a wave of liquid, with the consequential contact on both surfaces of the support with said liquid;

the immersion of the suport into the liquid preferably while subjected to stirring;

the dragging or (displacement) of the support through the liquid;

the skimming by the support of the surface of the liquid;

the atomization (nebulization) of the liquid onto the support;

the immersion of the support into a curtain of liquid;

the projection onto the support of sprays or jets of liquid.

In the cases of contact of the support with a wave of liquid, this latter may be generated with the same methods already used for producing waves of molten metal in the "WAVE WELDING" process. In this connection, reference is made to the book "Soldering in Electronics", by R. J. Klein Wassink, Electromechanical Publ., 1984.

According to a variant that may be applied to the contact realized by means of a wave or of dragging displacement as indicated hereinabove, the liquid perfluoropolyether may be disposed as a layer, of a greater or lesser thickness, over a conventional soldering bath consisting of molten metal. In that case it will be possible to immerse the support into the bath in such a way that its lower face shall be in contact with the molten metal while the upper face is immersed in the overlying perfluoropolyether layer.

It will thus be possible to obtain the soldering of the electronic components arranged under the support by deposition of molten metal, while the soldering of the components arranged on top of the support will be obtained by the binding action of the soldering material that will be promoted by the contact with the perfluoropolyether, heated by the molten metal (and vice versa). In this way the advantages of the two methods are combined, besides which one achieves protection of the metal bath from oxidation.

A practical way for realizing the process according to the present invention may include the following operations in the given order:

(1) Preparation of the support with the components to be soldered, kept in place, in the case of their being disposed on the surface, by a suitable soldering material or, if mounted through metallized holes filled with soldering materials, by means of conventional mechanical devices.

(2) Heating up of the assembly of (1) for a convenient stretch of time and at a suitable temperature, in general for 15-20 seconds at between 80° and 100° C., in hot air, in order to remove the low volatile components. Said operation allows degassing and/or partially vulcanizing the soldering materials so as to ensure a partial fixing of the components on the support in preparation for the subsequent phases of the process.

(3) Introduction of the supports coming from operation 2 into a system for treatment with perfluoropolyether in the liquid state, under the previously described conditions and with the object of developing the binding properties of the soldering material.

The present operation may include, besides the soldering, operations for pre-heating and cooling the assembly in order to minimize the thermal stress on the pieces.

A predetermined profile of the process temperature may be obtained by introducing the pieces into a sequential system in which the liquid itself is kept at different temperatures and where the pieces are heated with quantities of heat depending on the temperature of the fluid, on the dwell time (residence time), and on the geometry of the zones. For this purpose there may be used one single device consisting of three liquid baths in which there take place, respectively, the preheating, the soldering, and the cooling of the assembly.

(4) The operations from (1) to (3) above may be followed, even if not altogether necessary, by the washing of the assembly by means of a thin film of the same liquid perfluoropolyether, in order to allow a recovery of the liquid itself. The dwelling time (residence time) of the piece, the temperature of the washing liquid, and the distance from which this latter is sprayed onto the assembly, will be chosen in such a way as to optimize the recovery of the liquid and the cooling down of the assembly.

If desired, the assembly may be subjected to washing with a solvent miscible with the liquid, for example 1-1-2-trichloro-trifluoroethane or its azeotropes. The other components of such azeotropes are commonly methanol, ethanol, isopropanol, and acetone. The solvent and the liquid may then be recovered by distillation and be recycled into the system at the appropriate points.

In the particular case in which the components are mounted on the surface of both faces of the support, in order to better insure the fixing of the components during the soldering phase, before operation (3) there may be carried out an additional operation which consists in wrapping the assembly in a suitable film or covering of thermoshrinkable material, for instance made of a synthetic polymer such as those mentioned below in Example 2. In such a case, because of the shrinkage of the film, on the assembly, the keeping in position of the components will be insured.

The operation may be facilitated by operating under conditions of a slight vacuum, for example of 10 Torr. Instead of said film there may be used, for the same purpose, a permeable material, for instance one made of a textile fiber. In such a case, this operation of wrapping the assembly may conveniently be carried out after operation (1) of the process.

The thermoshrinkable material is preferably chosen from those having a shrinking temperature of between 150° and 180° C., so as to carry out the shrinkage operation on the film simultaneously with the pre-heating of the assembly. In the case in which the shrinkage temperature is lower, a suitable heating system, for example by hot air, will allow one to carry out the thermoshrinking operation before operation (3).

When one adopts this technique, the piece coming out of point (3) will be washed by a jet of liquid as described under point (4).

Thereupon there will be carried out the removal of the film from the assembly which in its turn will be cleaned according to the usual techniques employed for the removal of possible fluxes.

The following examples are given to further illustrate this invention, but without any intention of limiting in any way the inventive scope of the invention itself.

EXAMPLE 1

On each of four ceramic material supports provided with a palladium-silver metallization, achieved by screen printing, using a soldering cream consisting of 62 Sn/36 Pb/2 Ag, there was mounted a component (a chip carrier) having 20 connection pins. Each assembly was degassed in air by heating for 15 minutes at 100° C. It was then treated in the following way:

(a) one of the four assemblies was immersed into a 'Galden LP' bath kept under stirring (a perfluoropolyether comprised in formula (I) and having a molecular weight greater than 5000, produced by Society MONTEFLUOS and having a viscosity at 20° C. of 1000 cSt) The temperature of the bath was 230° C. The immersion time amounted to 13 sec.

(b) Another of the assemblies was passed through a stationary wave of GALDEN LP at a temperature of 235° C. The travelling speed of the piece through the wave was 0.5 cm/sec.

(c) A third assembly was kept in contact, with only just its lower face, with the GALDEN LP so as to avoid the liquid migrating to the upper part of the ceramic support. The temperature of the fluid was 230° C. The contact time was 22 sec.

(d) The fourth assembly was treated as at point (c), with the difference that a thin film of the fluid was allowed to migrate to the upper part of the ceramic support. The temperature was 230° C. The contact time was 12 sec.

In all these cases the welding or soldering was observed to be good. In one case only, during the operation (a) the "chip carrier" had budged from its position. This proved that a preventive degassing of the assemblies is needed especially in the case of immersion.

EXAMPLE 2

In order to better keep the components in position, a series of assemblies of the type described in Example 1, with components mounted on both faces, were coated with a polyethylene, high-resistance nylon, and polyethyleneterephtalate (P.E.T.), respectively. The films were applied under a light vacuum, and were then heat-shrunk in hot air.

The assemblies were then immersed into a thermostatically-controlled 'GALDEN LP' bath, having a controlled temperature of between 220° and 240° C.

The soldering times for the assemblies were slightly greater than those measured in Example 1-a. This shows that all these systems do not hinder in any significant way the heat transfer rate from the perfluoropolyether to the assembly.

The polyethylene film decomposed at melt temperature, though maintaining its integrity for a sufficient time to keep the component firmly in position on the support.

EXAMPLE 3

A program similar to that described in Example 1 was carried out on supports of glass fibers impregnated with commercial epoxy resin, mounting components on its surface and in holes passing through the support, respectively, four "dual-in-line packaged IC" and various descrete components. The devices had been fixed in place with a soldering cream consisting of 62 Sn/36 Pb/2Ag. Thereupon there was carried out a degassing at 100° C. for 10 to 15 seconds.

These were then processed in the following ways:

(a) One assembly was subjected to the same procedure gas that described in Example 1-a, with immersion time of 15 seconds;

(b) A second assembly was subjected to the same procedure as that of Example 1-c, with a contact time of 42 seconds;

(c) Still another assembly was subjected to the same procedure as that described in Example 1-d, with a contact time of 25 seconds.

For comparison purposes, analogous assemblies were kept immersed, at a temperature of 232° C., in saturated vapor of 'GALDEN LS/230' (a perfluoropolyether within formula (I), having a molecular weight of about 800; produced by Soc. MONTEFLUOS).

The time necessary to obtain the re-melting of the soldering creams amounted to 45 seconds.

In all the above cases (a), (b) and (c), the welding was judged good and no drawbacks of displacements of the pieces on the support were observed.

The transfer times of the heat from the fluid to the piece proved, moreover, shorter than those necessary when soldering in vapor phase.

EXAMPLE 4

A series of tests analogous to those of Example 1 was carried out using a support mounting conventional components fixed in holes passing through the support itself. Into the metallized holes of the support was applied a soldering paste consisting of 62 Sn/36 Pb/2Ag. The temperature of the 'GALDEN LP' bath was 230° C. The assemblies were kept immersed in the fluid for 18 seconds. The quality of the weldings was judged to be good.

In all the examples from 1 to 4, the cleaning of the assemblies after the soldering was carried out with a washing system, commercially available on the market, which employs an ultrasonic bath and 1-1-2-trichloro-trifluoroethane.

The assemblies were cleaned in all the cases of Examples 1-4, for 1 minute.

In no case was there visual evidence of residues of perfluoropolyether on the assemblies. After cleaning, the polluted 1-1-2-trichloro-trifluoroethane solvent remaining in the washing machine was recovered by separating it from the perfluoropolyether by distillation.

At the end of the tests mentioned in the four examples, the perfluoropolyether remaining in the soldering device, as well as that recovered by distillation from the cleaning bath of the assemblies, was suitably filtered in order to remove residual particles, various impurities, and gases dissolved therein. The liquid thus obtained did not show, upon analysis, any alterations whatsoever of its chemical or physical characteristics.

What is claimed is:

1. A process for bonding electronic components to a support, the process consisting essentially of arranging said components on the support together with a bonding material, and then placing the thus-obtained assembly in contact with a perfluoropolyether in the liquid state having a temperature equal to or greater than the temperature at which said bonding material develops its binding properties, said perfluoropolyether having a molecular weight exceeding 5000.

2. A process according to claim 1, characterized in that the perfluoropolyether has the formula (I):

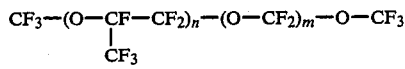

wherein: n is a number between 5 and 50; m=a number such that n/m between 10 and 50.

3. A process according to either claim 1 or 2, characterized in that the contact between the perfluoropolyether and said assembly is achieved through a perfluoropolyether wave that skims the lower surface of the support.

4. A process according to either claim 1 or 2, characterized in that said contact is achieved by passing the support through a perfluoropolyether wave.

5. A process according to either claim 1 or 2, characterized in that the contact is effected by immersing the support in the perfluoropolyether.

6. A process according to either claim 1 or 2, characterized in that said contact is effected by displacing the support through the perfluoropolyether.

7. A process according to either claim 1 or 2, characterized in that said contact is achieved by the skimming of the perfluoropolyether bath surface by the support.

8. A process according to either claim 1 or 2, characterized in that said contact is effected by means of atomizing or by the projection of perfluoropolyether sprays or jets onto the support.

9. A process according to either claim 1 or 2, characterized in that said contact is achieved by immersing the support into a perfluoropolyether curtain.

10. A process according to either claim 1 or 2, characterized in that the support carrying the electronic components and the soldering material is wrapped, before said contact, in a film of thermo-shrinkable material.

11. A process according to either claim 1 or 2, characterized in that the support containing said electronic components and the soldering material is wrapped, before said contact, in a covering of permeable material.

12. A process according to either claim 1 or 2, characterized in that the perfluoropolyether is used as a layer covering a bath of molten metal.

* * * * *